United States Patent
Zitelli et al.

(10) Patent No.: US 11,673,327 B2
(45) Date of Patent: Jun. 13, 2023

(54) APPARATUS FOR 3D PRINTING OF BOTTOM-UP PHOTO-CURING TYPE, WITH INDEPENDENT ELASTIC MEMBRANE SYSTEM AND TILTING REFERENCE AND RELATIVE METHODS OF USE

(71) Applicant: Sisma S.p.A., Piovene Rocchette (IT)

(72) Inventors: Gianni Zitelli, Padua (IT); Federico Iacovella, Padua (IT); Vittorio Gaudino, Padua (IT); Massimo Petrilli, Padua (IT)

(73) Assignee: Sisma S.p.A., Piovene Rocchette (IT)

( * ) Notice: Subject to any disclaimer, the term of this patent is extended or adjusted under 35 U.S.C. 154(b) by 0 days.

(21) Appl. No.: 17/042,223

(22) PCT Filed: Mar. 27, 2019

(86) PCT No.: PCT/IT2019/050068
§ 371 (c)(1),
(2) Date: Sep. 28, 2020

(87) PCT Pub. No.: WO2019/186611
PCT Pub. Date: Oct. 3, 2019

(65) Prior Publication Data
US 2021/0023784 A1    Jan. 28, 2021

(30) Foreign Application Priority Data
Mar. 29, 2018  (IT) .................... 102018000004065

(51) Int. Cl.
*B29C 64/20* (2017.01)
*B29C 64/245* (2017.01)
(Continued)

(52) U.S. Cl.
CPC .......... *B29C 64/245* (2017.08); *B29C 64/135* (2017.08); *B33Y 10/00* (2014.12); *B33Y 30/00* (2014.12)

(58) Field of Classification Search
None
See application file for complete search history.

(56) References Cited

U.S. PATENT DOCUMENTS

| 6,547,552 B1 * | 4/2003 | Fudim | B29C 64/129 264/401 |
| 2013/0292862 A1 * | 11/2013 | Joyce | B29C 64/35 425/135 |

(Continued)

FOREIGN PATENT DOCUMENTS

| WO | WO 2012/021940 | 2/2012 |
| WO | WO 2013/026087 | 2/2013 |
| WO | WO 2016/122408 | 8/2016 |

OTHER PUBLICATIONS

International Search Report and the Written Opinion dated Jul. 31, 2019 From the International Searching Authority Re. Application No. PCT/IT2019/050068. (12 Pages).

(Continued)

*Primary Examiner* — Armand Melendez

(57) ABSTRACT

The present invention concerns an apparatus for 3D printing of bottom-up photo-curing type, comprising a light source (26) above which a tank (10) containing a photo-curing liquid material (24) is placed inside which it is immersed an extraction plate (25), which is equipped with moving means with alternating rectilinear motion, along a direction perpendicular to the bottom of said tank (10) from a position at a distance from the bottom of said tank (10) equal to the thickness of a layer obtainable by photo-curing of said photo-curing liquid material (24), the bottom (14) of said tank (10) being constituted by an elastic membrane (23)

(Continued)

transparent to the radiation of said light source (26), said tank (10) being positioned in correspondence with a hole (13) of a support plate (12), said hole being provided with a rigid support (11), transparent to the radiation of said light source (26), wherein said rigid support (11) is provided with means for displacing with respect to said hole (13), from a position in which said rigid support (11) occupies said hole (13), and is in contact with elastic membrane (23), to a position in which said rigid support (11) deviates from said hole (13) and from said elastic membrane (23), characterised in that between said elastic membrane (23) and said rigid support (11) means are placed apt to increase adherence between said elastic membrane (23) and said rigid support (11).

The invention additionally concerns a method of use of said apparatus for 3D printing.

8 Claims, 8 Drawing Sheets

(51) Int. Cl.
*B33Y 10/00* (2015.01)
*B33Y 30/00* (2015.01)
*B29C 64/135* (2017.01)

(56) References Cited

U.S. PATENT DOCUMENTS

| | | | |
|---|---|---|---|
| 2014/0191442 A1* | 7/2014 | Elsey | B33Y 10/00 264/401 |
| 2015/0231831 A1* | 8/2015 | El-Siblani | B29C 64/135 425/150 |
| 2016/0046071 A1 | 2/2016 | Kuhnlein | |
| 2017/0129175 A1* | 5/2017 | Zitelli | B29C 64/124 |
| 2018/0029296 A1* | 2/2018 | Van Esbroeck | B29C 64/286 |

OTHER PUBLICATIONS

Rapporto di Ricerca e Opinione Scritta [Search Report and Written Opinion] dated Dec. 28, 2018 From the Ministero Dello Sviluppo Economico, Direzione Generale Sviluppo Produttivo e Competitivita, Ufficio Italiano Brevetti e Marchi Re. Application No. IT 201800004065. (9 Pages).

* cited by examiner

APPARATUS FOR 3D PRINTING OF BOTTOM-UP PHOTO-CURING TYPE, WITH INDEPENDENT ELASTIC MEMBRANE SYSTEM AND TILTING REFERENCE AND RELATIVE METHODS OF USE

RELATED APPLICATIONS

This application is a National Phase of PCT Patent Application No. PCT/IT2019/050068 having International filing date of Mar. 27, 2019, which claims the benefit of priority of Italian Patent Application No. 102018000004065 filed on Mar. 29, 2018. The contents of the above applications are all incorporated by reference as if fully set forth herein in their entirety.

FIELD AND BACKGROUND OF THE INVENTION

The present invention concerns an apparatus for 3D printing of bottom-up photo-curing type, with independent elastic membrane system and tilting reference and the relative methods of use.

More in particular, the invention relates to an innovative method of producing three-dimensional objects, by means of a photo-curing process of photosensitive materials, which allows three-dimensional objects to be made according to a sequential formation process, considerably increasing speed, precision and mechanical properties of the final product, compared to what can be obtained by the prior art methods.

The invention relates to the field of three-dimensional printing, commonly called 3D printing, and in particular to the 3D printing technology by photo-curing, that is curing of a particular type of polymer due to exposure to light radiation.

It is known that in the field of 3D printing technology by photo-curing two basic technologies can be included, stereolithographic printing, in which an emitting laser at about 400 nm is used, to solidify by an emitted beam a photo-curing polymer in the liquid state that is placed in a special tank; and the DLP printing (acronym of the English expression Digital Light Processing), according to which a photo-curing polymer (or photo-curing liquid resin) always in the liquid state in a tank, is exposed to the light radiation emitted by a device similar to a projector.

According to both of these technologies, the printing process proceeds by making one layer after another, or by solidifying a first layer adhering to a support plate (or extraction plate) and then a second layer adhering to said first layer and so on until formation of the complete object. According to this technology, therefore, the data representing the three-dimensional object to be realized are organized as a series of two-dimensional layers that represent cross-sections of the object.

The Bottom-Up process, applied to both SLA and DLP machines, requires that the object extraction plate moves from bottom to top, with a tilting layer-by-layer movement (layer upon layer).

In essence, the process of forming the three-dimensional object is as follows:
  a software subdivides the 3D model, supplied as an input for printing, in an ordered succession of layers, of a thickness determined according to the technology adopted, the opacity of the polymer, the quantity of catalyst, the degree of precision to be obtained and the characteristics of the machine supplied, usually between 50 and 200 microns, but, in any case, a succession of a discrete and finite number of layers;
  a supporting plate, also said extraction plate, made of a material able to facilitate bonding on itself of the first polymer layer, moves at a predetermined distance according to the first layer and expects that the light beam (SLA or DLP) solidifies the first layer; then it is raised a sufficient distance to allow the newly formed layer to detach from the bottom of the tank (usually about 1 mm) and then goes back down the same distance, minus the predetermined distance for the formation of the second layer, and so on up to the formation of the entire object.

The movement of go and come resulting therefrom, also said tilting movement, has two main purposes: allows the newly formed layer to detach from the bottom of the tank, and at the same time allows a new quantity of liquid uncured resin to interpose between the newly formed layer and the bottom of the container, to allow the renewal of material still in the liquid state under the already solidified layer, for the curing and the formation of the next layer.

A no less important issue concerns the characteristics of the resin collection system, the so-called tank, which has the task not only of containing the liquid polymer from which the printed three-dimensional object is obtained by photo-curing, but also that of facilitating the formation and detachment of the newly formed layer, and of favoring the bonding of the same to the extraction plate, without the mechanical resistance compromising its integrity.

By analyzing the characteristics of the solutions according to the prior art, it is possible to schematize the bottom-up collection systems, both for DLP and SLA technology, as follows:
  resin container, with hollow bottom;
  light radiation transparent material, to cover the bottom;
  membrane of non-stick material covering the transparent material.

A hole is made, usually in the center of the collection system, to allow the passage of the light beam that must trigger the photo-curing phenomenon, the hole is then covered by a glass that has excellent transparency characteristics to the light radiation (in order not to lose incident light power), such as quartz and borosilicate. Finally, certainly, the most important part to allow the process to proceed correctly concerns the covering of the glass with a membrane of non-stick material, in order to allow the first layer to attach itself to the extraction plate and to the subsequent layers to join together in sequence.

The failure of the process would cause the newly formed layer to precipitate at the bottom of the tank, interrupting the formation process and causing the printing routine to fail.

In the following, the limiting effects of this technology are investigated, which make the production of an object very slow (up to hours per centimeter), very unstable and with the ability to produce small objects.

The first limitation in the adoption of photo-curing technologies from the bottom to the top is that of the non-stick capacity of the membrane placed on the bottom glass.

In fact, as already mentioned above, this type of three-dimensional printing is based on the ability of the newly formed layer to bind, in the first layer, to the extraction plate, and, in subsequent layers, to the layers that precede. If, however, the mechanical resistance imposed by the lower membrane is greater than the cohesion force of the upper one, the cured layer will inevitably remain at the bottom of the tank, interrupting the process of creating the three-dimensional printed object.

Beyond the most recent innovative techniques, such as the control of the inhibition layer with oxygen or with self-lubricating materials, two known solutions are usually identified, widely adopted for the realization of the non-stick membrane placed above the bottom glass:

the use of materials such as Teflon or polytetrafluoroethylene, also said PTFE;

the use of silicone-based materials, such as polydimethylsiloxane, also said PDMS.

In the first instance, teflon and PTFE are particularly suitable for 3D printing applications, since they have a high thermal capacity (important in controlling the exothermic photo-curing reaction) and at the same time a very low coupling (almost inert behavior) with photo-curing resins, which are particularly aggressive/reactive with other materials.

The major disadvantage that makes teflon and PTFE almost inapplicable (except for particular applications with a very low cross-section of the object to be printed) consists in the absolute lack of elasticity of these materials. In particular, according to this prior art technology, a teflon sheet is usually used (with a thickness between 125 and 250 microns) resting on the glass plate placed on the bottom of the tank, in the absence of air between the teflon sheet and the glass plate. Under these conditions, the teflon sheet tends to adhere perfectly to the glass plate, inevitably becoming a single body with the bottom of the tank. As will be explained below, this condition of stiffness generates, between newly cured object and teflon, a phenomenon called suction effect, which causes a mechanical stress which tends (especially for cuneiform objects) to plastically deform teflon, making it impossible to continue the printing process and/or the tank re-use and, more importantly, the enormous mechanical stress generated during tilting tends to "break" the object, making a successful printing fortuitous and not repeatable.

PDMS and silicones, on the other hand, are the most widely spread and used materials, as they respond to a compromise condition between chemical interaction and mechanical stress.

Usually, these materials are cast and then glued to the bottom of the tank and, with special techniques, brought to the same level to ensure the flatness between the extraction plate and the bottom of the tank (to ensure the formation of a layer without deformation).

These materials are preferred because the greater surface "tenderness" of the non-stick membrane arranged above the bottom glass allows the reduction of the phenomenon of the suction effect, as will be explained below.

The biggest disadvantage that limits the application of these materials and makes the stabilization of the printing process extremely complex is due to their limit of applicability, that is to the lower thermal resistance and to the greater chemical coupling with the resin.

In fact, the silicone material tends to absorb more easily the resin and the exothermic reaction produced by the polymerization (locally exceeding 400° C. with some resins) tends to crystallize the PDMS, with the consequence that the subsequent movement of the extraction plate generates a mechanic stress that tends to "unnerve", and therefore to whiten, the support material (a phenomenon called "white shadow"). Once again this loss of capacity makes the printing process unstable.

The second limitation in the adoption of photo-curing technologies from the bottom upwards is the so-called suction effect, which comes to be created between the surface of the object and that of the membrane of non-stick material that covers the light radiation transparent plate placed on the bottom of the tank.

It is immediately evident how the conditions for the onset of this phenomenon are established. In fact, the layer is immersed in the resin until it arrives at a distance s (thickness of the $n^{th}$ layer) from the non-stick membrane (both surfaces are coplanar and perfectly flat just to give precision to the layers that will be formed); then a new photo-curing layer is generated. The absence of air actually creates a vacuum between the two surfaces, which are surrounded by a liquid with a higher viscosity, in particular the more the two surfaces in contact have a large surface and the more the supports that interfere with the layer being formed are rigid; the mechanical stress that the system and consequently the newly formed layer (only a few tenths of a millimeter in thickness) undergo are enormous, with the risk therefore of tearing the newly solidified layer, which will not stick to the upper surface, leading to the interruption of the printing process. To reduce the effects of this phenomenon one proceeds in such a way that the surface of the extraction plate and of the objects to be created is sufficiently small (usually with technologies of this type objects of the size of about 4×4, 5×5 centimeters are created) and at the same time that the ascent rate of the extraction plate in the tilting phase is extremely reduced, significantly increasing the printing time (generally the tilting time turns out to be about 40% of the total time).

The best solution, however, consists in using a membrane of non-stick material with a certain degree of flexibility, to generate a peeling phenomenon. In particular, the use of a silicone-based membrane, which has a large elastic capacity, and the simultaneous removal (or distancing) of the rigid bottom of the tank, allows the activation of the peeling phenomenon and, therefore, a significant reduction in the suction effect.

In printing using "free field" elastic membranes, however, three problems are triggered:

the "rope" phenomenon, due to gravity, generates a distortion of the layer and a loss of precision, the absence of compression of the newly formed layer between two rigid layers weakens the adhesion of the object to the extraction plate, and the "exfoliation" effect of the object is increased, again due to the lack of compression between two rigid planes.

According to an alternative technique, the elastic membrane rests on a rigid support. This technique would theoretically be the ideal solution to the immediate resolution of the problem of the suction effect, at the same time without running into the problems of the "free field" membrane system, since the bottom of the tank would give its reference contribution and compression, and at the same time it would maintain the planarity of the membrane and at the same time the elastic membrane, free to "support" the detachment of the object would reduce the suction effect.

Even the silicone material would benefit from it, reducing the mechanical stress to which the portions of material in crystallization are subjected by thermal effect.

In reality, the same membrane, leaning on the rigid support, and removing the air that separates them, tends to attach itself to it, effectively transferring the suction effect between the two media, and canceling all the benefits mentioned above.

In this context, the solution according to the present invention is inserted, which proposes to:
- eliminate, or at least reduce, the suction effect,
- reduce the mechanical stress induced on the object being formed,
- solve the problem of the rope in elastic membrane systems,
- increase printing accuracy,
- increase the operating life of silicone-type materials.

Moreover, the solution according to the present invention achieves the possibility of "stepping" printing objects both with small and large cross-section.

These and other results are obtained according to the present invention by proposing an apparatus for bottom-up photo-curing type 3D printing, with an elastic membrane resting on a rigid system, or on the assembly consisting of the perforated bottom of the tank and the glass plate that covers the hole, in which the rigid system is connected to means which generate a tilting movement with respect to the rest of the tank, as well as corresponding methods of operation.

SUMMARY OF THE INVENTION

The object of the present invention is therefore to provide an apparatus for 3D printing of bottom-up photo-curing type, with independent elastic membrane system and tilting reference and the relative methods of use which allow to overcome the limitations of bottom-up photo-curing 3D printing systems according to the prior art and to obtain the technical results previously described.

A further object of the invention is that said apparatus and said methods can be realized with substantially contained costs, both as far as production costs are concerned and with regard to management costs.

Not least object of the invention is to propose a simple, safe and reliable method for 3D printing of bottom-up photo-curing type, with independent elastic membrane system and tilting reference and the relative methods of use.

It therefore forms a first specific object of the present invention an apparatus for 3D printing of bottom-up photo-curing type, comprising a light source above which a tank containing a photo-curing liquid material is placed, inside which it is immersed an extraction plate, which is equipped with moving means with alternating rectilinear motion, along a direction perpendicular to the bottom of said tank from a position at a distance from the bottom of said tank equal to the thickness of a layer obtainable by photo-curing of said photo-curing liquid material, the bottom of said tank being constituted by an elastic membrane transparent to the radiation of said light source, said tank being positioned in correspondence with a hole of a support plate, said hole being provided with a rigid support, transparent to the radiation of said light source, wherein said rigid support is provided with means for displacing with respect to said hole, from a position in which said rigid support occupies said hole, and is in contact with elastic membrane, to a position in which said rigid support deviates from said hole and from said elastic membrane, and wherein between said elastic membrane and said rigid support a layer of an adhesive component can be present.

Preferably, according to the invention, said rigid support is coupled on one side, with the possibility of rotation around a hinge axis, to said support plate, the opposite side of said rigid support being coupled to a movement system.

Furthermore, according to the invention, said tank can be removable.

A second specific object of the present invention is also a method for 3D printing of bottom-up photo-curing type, operated by means of the previously defined apparatus, comprising the following steps:
a) forming a solid layer on an extraction plate by photo-curing a photo-curing liquid material comprised inside a tank, in the space between an extraction plate and an elastic membrane, wherein a rigid support is in contact with the lower side of said elastic membrane;
b) removing said rigid support from said elastic membrane, said elastic membrane, remaining attached to said rigid support, with progressive detachment of said extraction plate;
c) lifting of said extraction plate, up to a new position of forming a solid layer;
d) returning of said rigid support to its initial position, in contact with said elastic membrane.

BRIEF DESCRIPTION OF THE SEVERAL VIEWS OF THE DRAWINGS

The present invention will now be described, for illustrative but not limitative purposes, according to a preferred embodiment thereof, with particular reference to the figures of the enclosed drawings, in which.

DESCRIPTION OF SPECIFIC EMBODIMENTS OF THE INVENTION

Figure 1:
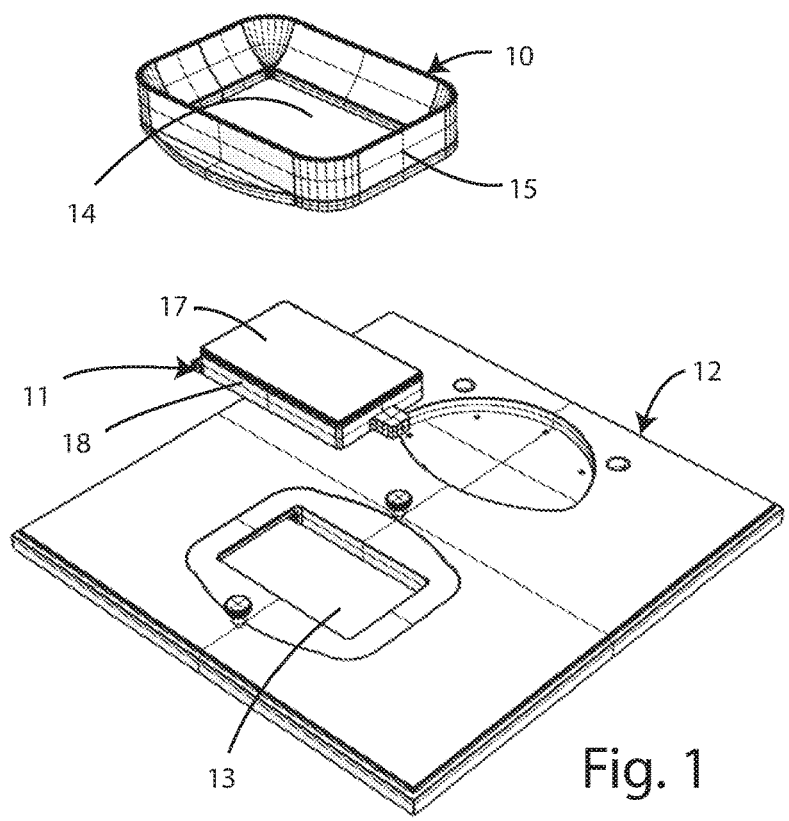
FIG. 1 shows a perspective view from above of the characteristic elements of an apparatus for 3D printing of bottom-up photo-curing type, with independent elastic membrane system and pivoting reference according to the present invention, exploded in its main components.
Figure 2:
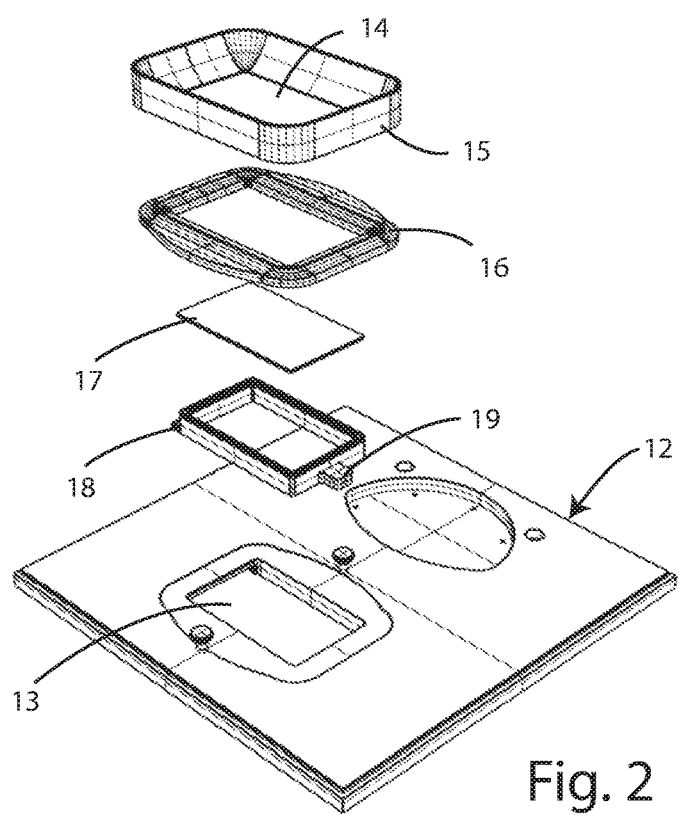
FIG. 2 shows a perspective view from above of the elements of the apparatus of FIG. 1, exploded in all its components.

Making preliminary reference to FIGS. 1-5, the characterising elements of an apparatus for 3D printing of bottom-up photo-curing type, with independent elastic membrane system and tilting reference according to the present invention essentially comprise a tank 10 (which can be considered as a consumable), a rigid support 11, transparent to the radiation of a light source, arranged on the side of said rigid support 11 opposite with respect to said tank 10, and a movement system 20. The tank 10 and the rigid support 11 are coupled to the rest of the apparatus (not shown) through a support plate 12, which has a hole 13, for the passage of the radiation coming from the light source.

In particular, the bottom 14 of the tank 10 consists of an elastic type membrane (free field elastic membrane), inserted with pre-tension (that is with a certain degree of tension) between the walls 15 of the tank 10 and a locking mask 16 of the pre-tensioned elastic membrane.

Figure 3:
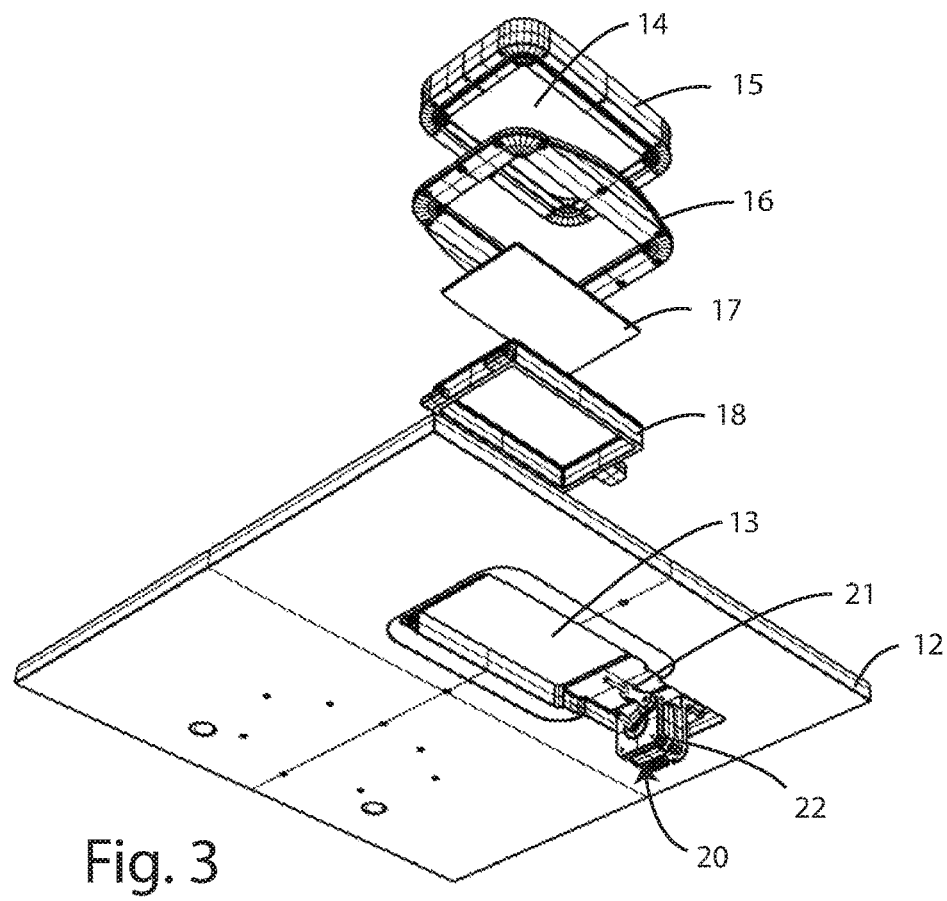
FIG. 3 shows a perspective view from below of the elements of the apparatus of FIG. 1, exploded in all its components.
Figure 4:
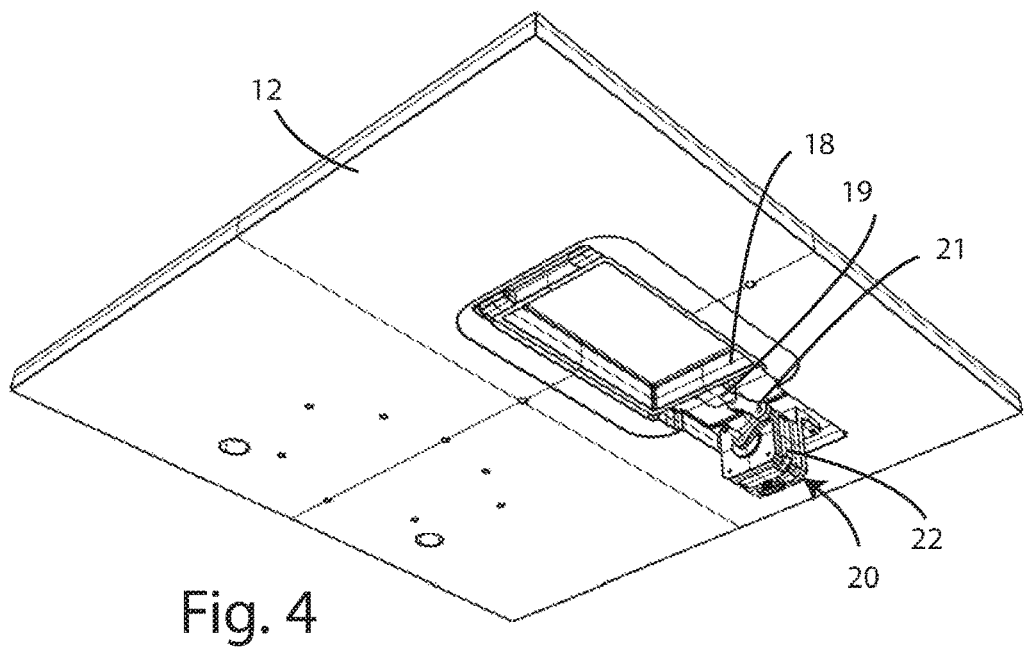
FIG. 4 shows a perspective view from below of the elements of the apparatus of FIG. 1, assembled, in a first phase of use.
Figure 5:
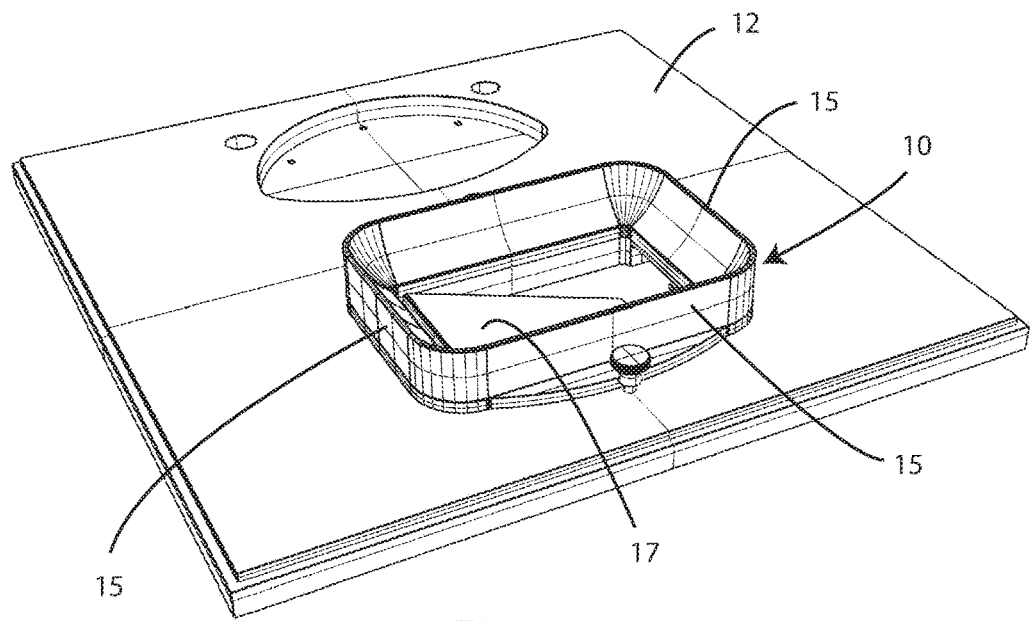
FIG. 5 shows a perspective view from above of the elements of the apparatus of FIG. 1, assembled, in a second phase of use.

The rigid support 11 consists of a glass plate 17, in particular borosilicate glass, housed on a drum 18. A first side of the drum 18 is coupled with possibility of rotation around a hinge axis to the support plate 12, while on a second side of the drum 18, opposite to said first side, there is an element 19 for coupling with a handling system 20, which in the embodiment shown in FIGS. 3 and 4 is constituted by a rod-crank mechanism 21, mounted on a rotary motor 22. The rotation of the rotary motor 22, transmitted to the drum 18 as a reciprocating rectilinear movement by means of the connecting rod-crank mechanism 21 and coupling element 19, rotates the rigid support 11 around the hinging axis, moving it away and subsequently bringing it closer to the bottom of the tank 10, which supports the elastic membrane, which instead remain fixed.

With reference to FIGS. 6A-6G, in which in addition to the elements already described with reference to the previous figures, the elastic membrane 23, a liquid resin 24 (contained in the tank 10), an extraction plate 25 and a light source 26 are also shown, the steps of a printing method which does not form the subject of the present invention are shown.

Figure 6A:
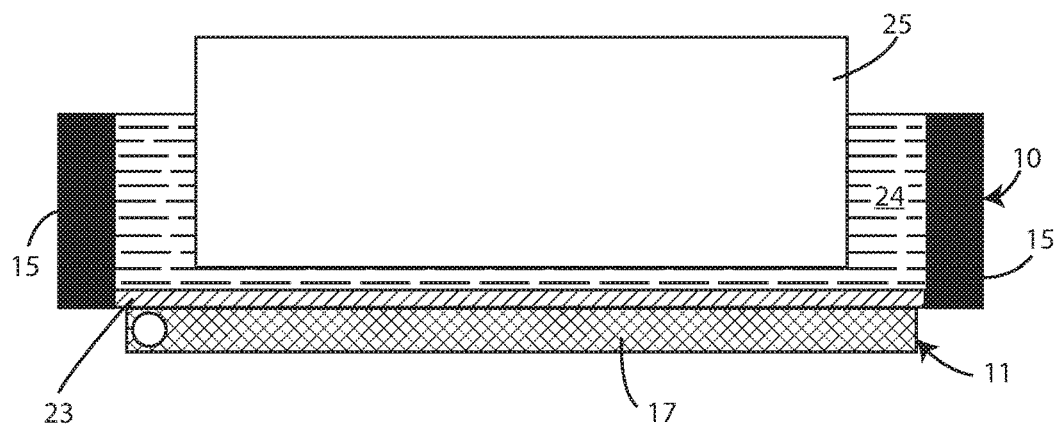
FIGS. 6A, 6B, 6C, 6D, 6E, 6F and 6G show a schematic representation of the elements of the apparatus of FIG. 1, assembled, in the steps of a printing method which does not form the subject of the present invention.

In a first step, shown in FIG. 6A, the rigid support 11, transparent to the radiation emitted by the light source 26, is in plane, in contact with the elastic membrane 23, which therefore rests on the rigid support 11 and more precisely on the glass plate 17. The extraction plate 25 is in the position closest to the elastic membrane 23, or at the distance of a layer from the elastic membrane 23, the space between the extraction plate 25 and the elastic membrane 23 being occupied by the liquid resin 24. In this first phase the light source 26 is on and begins to polymerize the liquid resin 26.

Figure 6B:
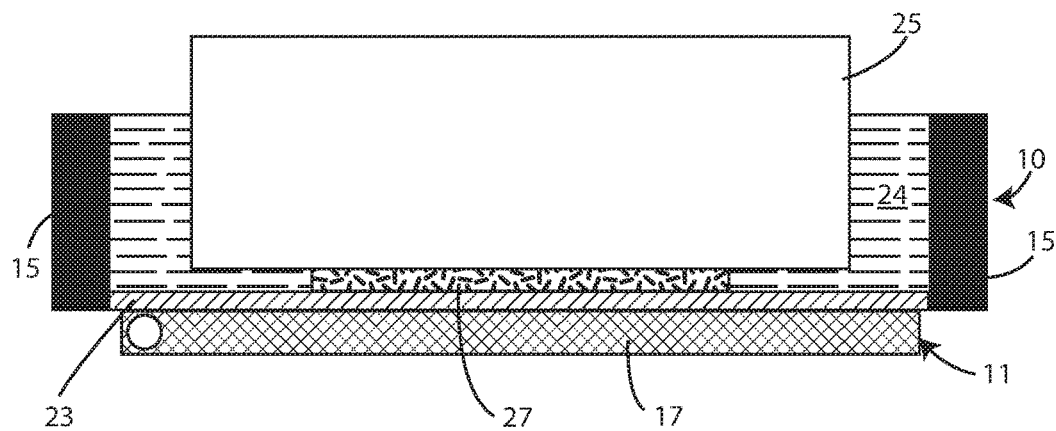
Figure 6B:
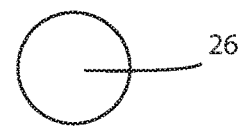

In the next step, shown in FIG. 6B, the formation of the first layer is completed and the light source 26 is then turned off. In this step, the glass plate 17 of the rigid support 11 is rigidly attached to the bottom of the elastic membrane 23. The system therefore behaves like a 3D printing machine of classic bottom-up photo-curing type, and the forming layer is compressed between two rigid bodies.

The result is the advantage of a high compression and precision of the layer (there is not the problem of the rope that would be generated by an elastic membrane without reference), but at the same time, the suction effect would be generated.

Figure 6C:
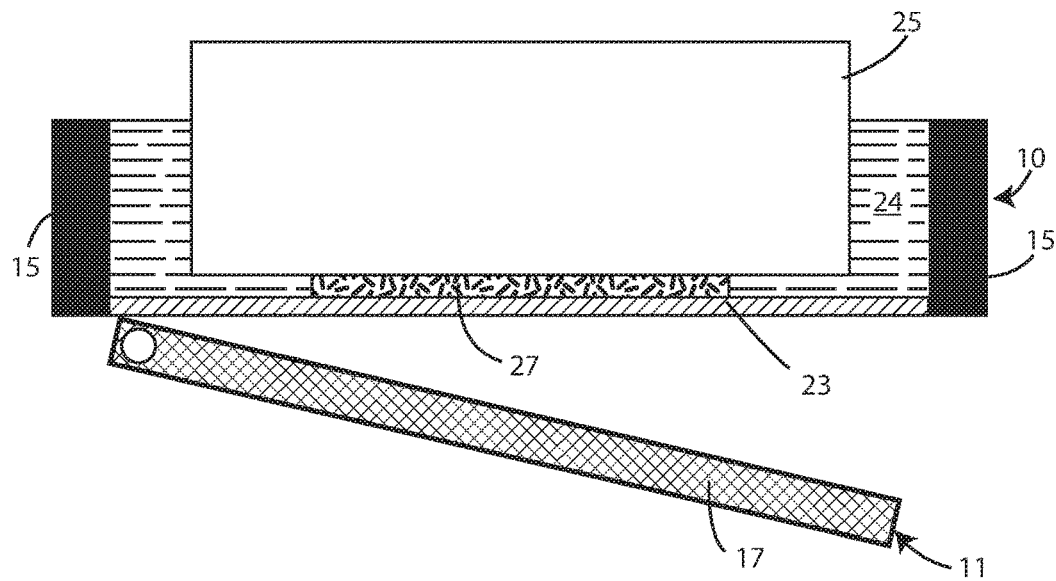
Figure 6C:
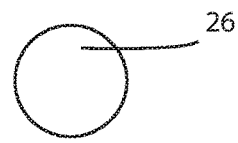

To counteract the onset of the suction effect, in the subsequent phase, shown in FIG. 6C, the rigid support 11 is made to rotate around the hinging axis, detaching itself from the elastic membrane 23, which instead remains attached by suction effect to the just cured layer 27. In this step, a linear support, rather than a rotary movement around an axis, of the rigid support 11 under the elastic membrane 23 would create a greater mechanical stress, which for applications where greater precision is required would be detrimental.

Figure 6D:
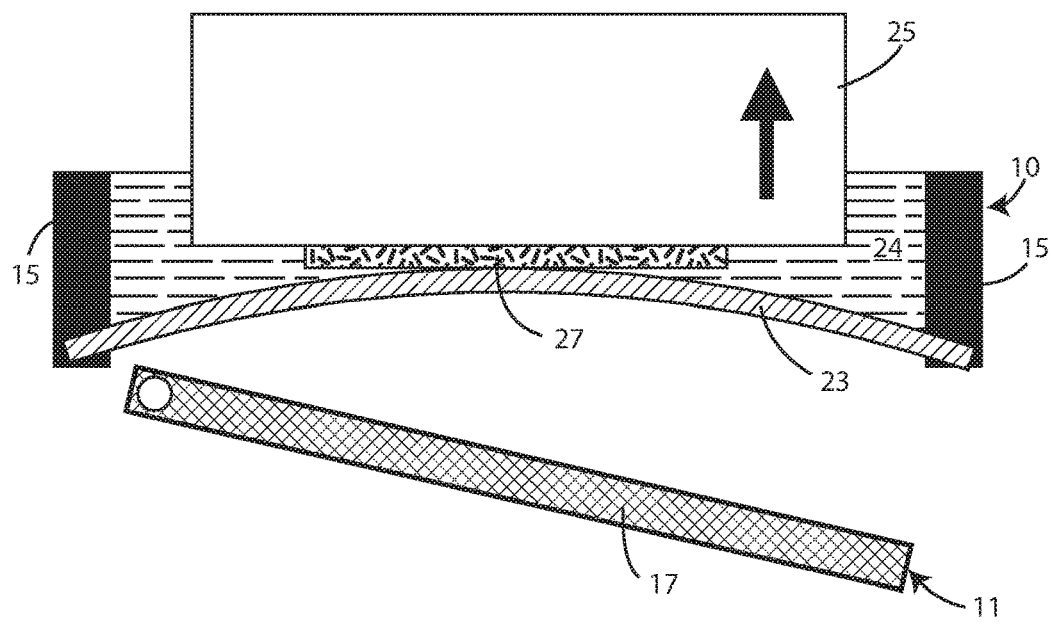

In the phase shown in FIG. 6D, the extraction plate 25 is made to rise to detach the layer 27 from the elastic membrane 23. The elastic membrane 23 triggers the peeling phenomenon by gently detaching from the newly formed layer 27. Therefore, the removal of the rigid support 11 from the base of the elastic membrane 23 allows the layer 27 to be detached, reducing/eliminating the previously described suction effect.

Figure 6E:
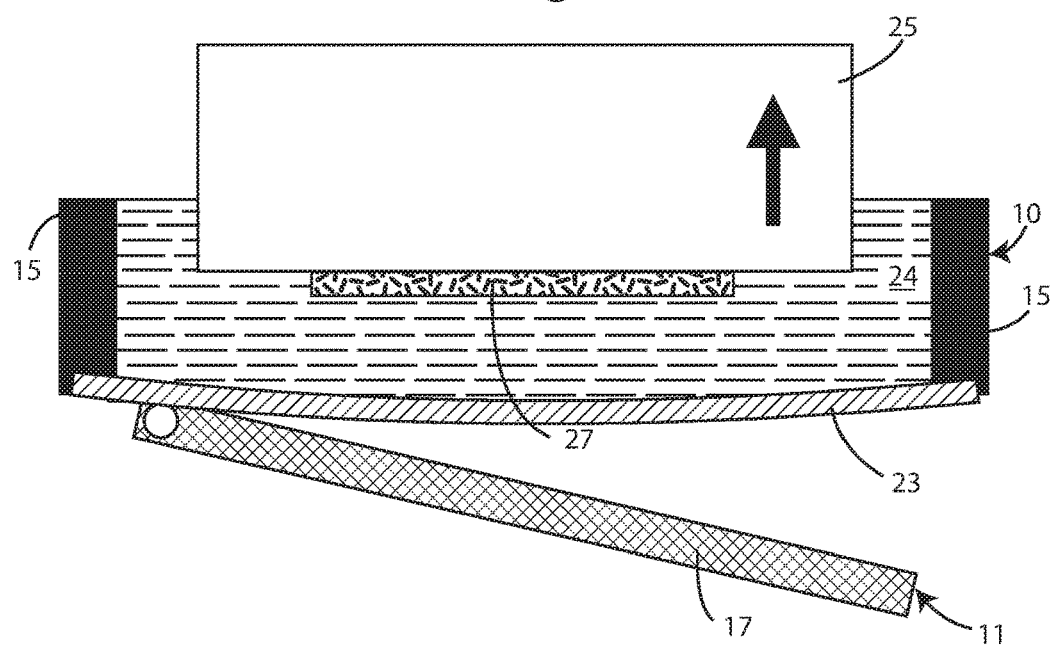

In the following step, shown in FIG. 6E, the elastic membrane 23, detaching itself from the layer 27, returns to the rest position. Under the load of the resin 24 and by its own weight the elastic membrane 23 could generate a buckling due to the phenomenon of the rope, which however in this case does not affect the shape of the layer 27.

Figure 6F:
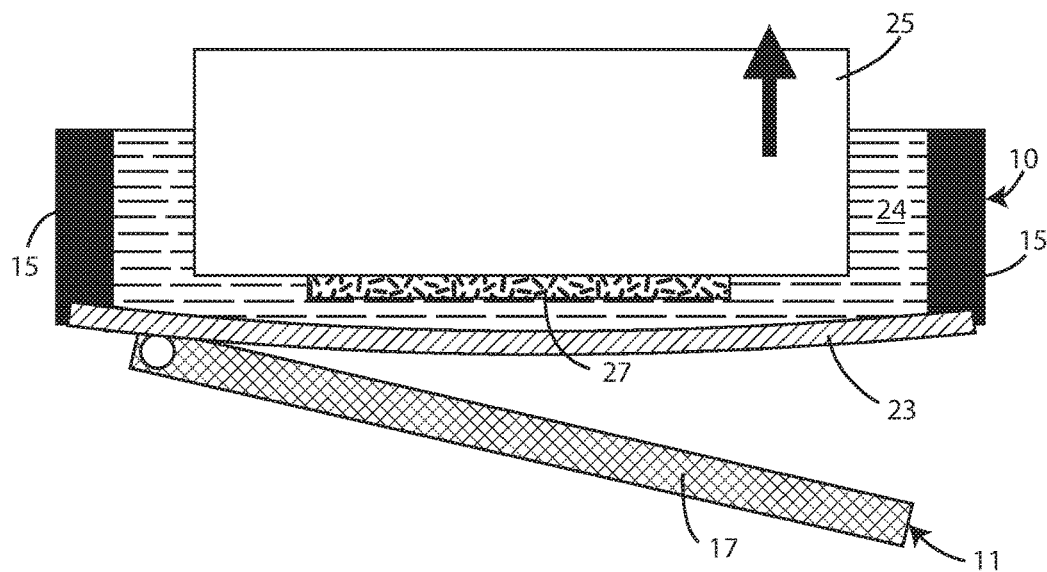
Figure 6F:

Subsequently, as shown in FIG. 6F, the extraction plate 25 descends towards the bottom of the tank 10, returning to the printing position of the next layer.

Figure 6G:
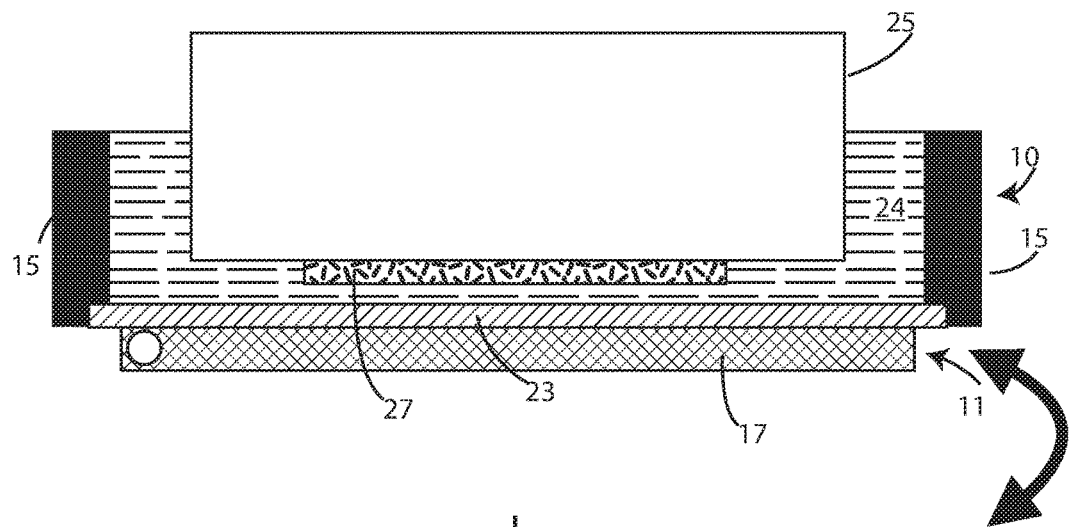
Figure 6G:
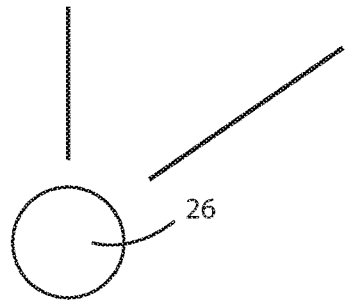

Finally, in the last step, shown with reference to FIG. 6G, the rigid support 11 is made to rotate around the hinging axis to return to the starting position, to then proceed with the formation of a subsequent layer.

It is evident that the described printing process allows to reduce/remove the suction effect, allowing a delicate removal of the elastic membrane 23 from the newly formed layer 27, thanks to the peeling effect consequent to the progressive removal of the extraction plate 25 from the elastic membrane 23. At the same time, during the formation of the layer 27, the position of the rigid support 11 allows to realize a layer 27 with a high compression and precision.

In a variant of the apparatus and of the 3D printing method according to the present invention, shown with reference to FIGS. 7A-7D, on the interface between the rigid support 11 and the elastic membrane 23 a device is applied which involves an adherence between the rigid support 11 and the elastic membrane 23 higher than that which is established between the same elastic membrane 23 and the newly formed layer 27, inducing a peeling phenomenon between the rigid support 11 and the elastic membrane 23. This arrangement could, by way of example, comprise a pressure/decompression system, or the presence of a layer 28 of adhesive component disposed between the rigid support 11 and the elastic membrane 23.

In particular, in the variant shown with reference to FIGS. 7A-7D, on the interface between the rigid support 11 and the elastic membrane 23 a layer 28 of adhesive component is applied, with the consequence of increasing the suction effect between the glass plate 17 of the rigid support 11 and the elastic membrane 23. It follows a different 3D printing process than the one described with reference to FIGS. 6A-6G.

In particular, according to this different embodiment of the apparatus for 3D printing according to the present invention, the corresponding printing method comprises the following steps.

Figure 7A:
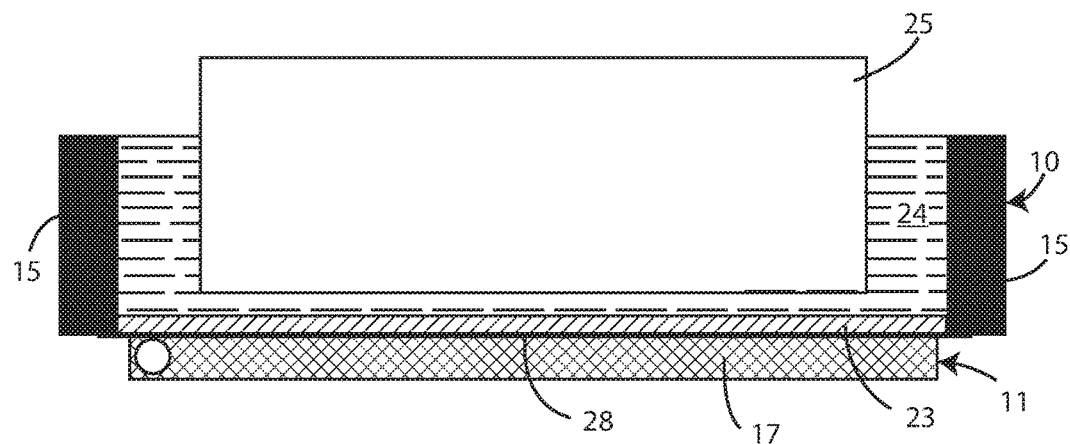
FIGS. 7A, 7B, 7C and 7D show a schematic representation of the elements of the apparatus of FIG. 1, assembled, in the steps of a printing method according to the present invention.

In a first step, illustrated with reference to FIG. 7A, the rigid support 11, transparent to the radiation emitted by the light source 26, is in plane, in contact with the layer 28 of adhesive component applied to the lower surface of the elastic membrane 23, which then rests on the rigid support 11 and more precisely on the glass plate 17, with the intermediation of only the layer 28 of adhesive component. The extraction plate 25 is in the position closest to the elastic membrane 23, or at the distance of a layer from the elastic membrane 23, the space between the extraction plate 25 and the elastic membrane 23 being occupied by the liquid resin 24. In this first phase the light source 26 is on and begins to polymerize the liquid resin 26.

Figure 7B:
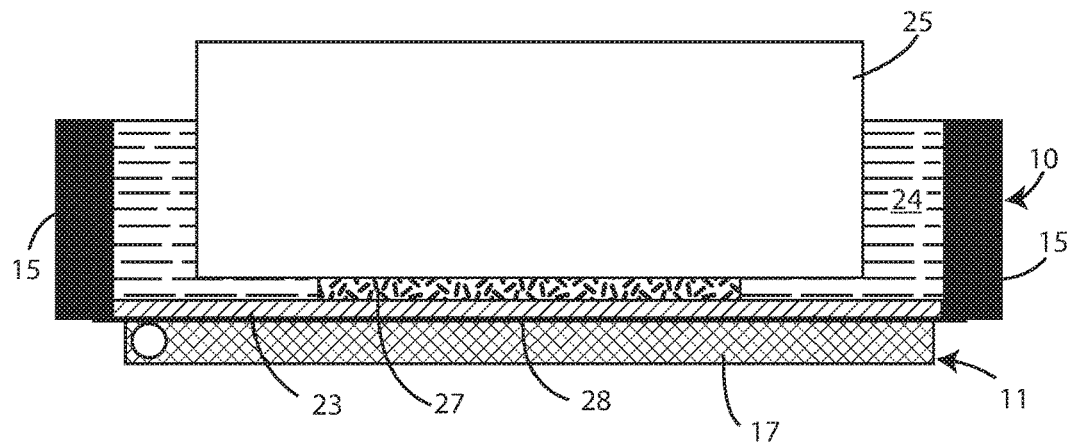

In the following step, shown in FIG. 7B, the formation of the first layer is completed and the light source 26 is then turned off. In this step, the glass plate 17 of the rigid support 11 is rigidly attached to the bottom of the elastic membrane 23, with the interposition of the layer 28 of adhesive component. In this case too, therefore, the system behaves like a classic 3D printing machine of bottom-up photo-curing type, and the layer under formation is compressed between two rigid bodies, with the consequent advantage of a high compression and precision of the layer (there is not the problem of the rope that would be generated by an elastic membranes without reference), but at the same time, the suction effect would be generated.

Figure 7C:
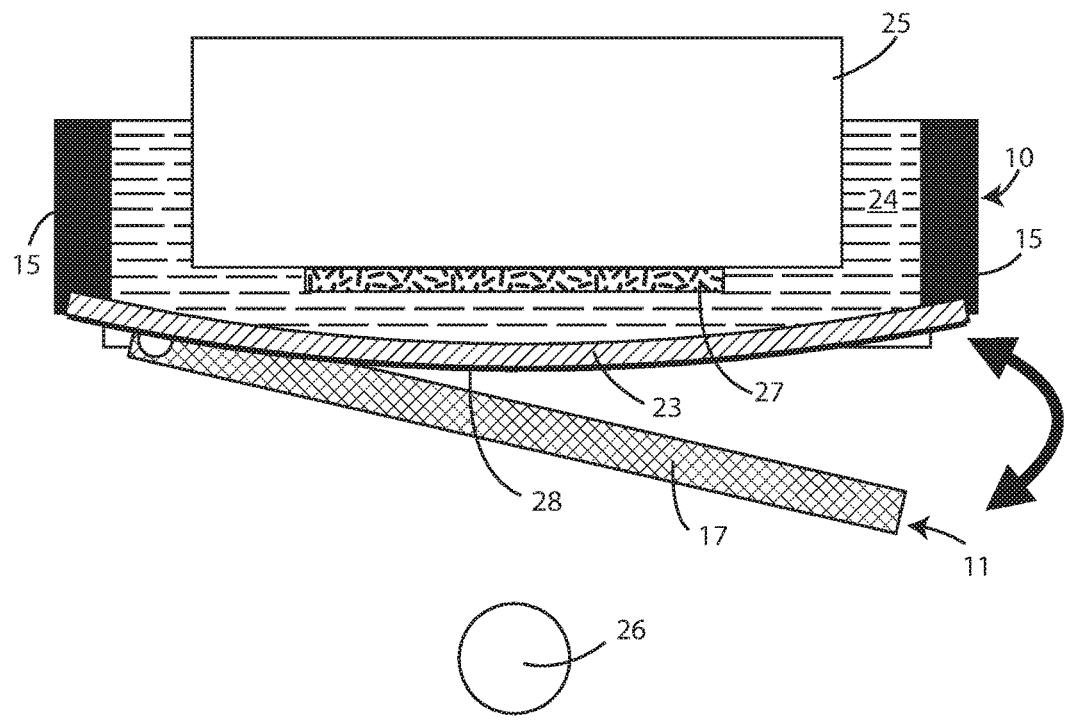

To counteract the onset of the suction effect, in the subsequent phase, shown in FIG. 7C, the rigid support 11 is made to rotate around the hinging axis, but in this case, thanks to the presence of the layer 28 of adhesive component, the adhesion force between the rigid support 11 and the elastic membrane 23 is greater than the adhesion force generated between the elastic membrane 23 and the newly cured layer 27, so that the same rigid support 11 tends to carry with it the elastic membrane 23, allowing a controlled detachment (inverse peeling) of the elastic membrane 23 from the rigid support 11, with a consequent reduction of the mechanical stress to which the elastic membrane is subjected 23.

Moreover, the removal of the elastic membrane 23 from the newly formed layer 27, which follows from the fact that the elastic membrane 23 tends to follow the rigid support 11 in its movement, generates a volume underlying the layer 27, which is filled by the liquid resin 24, thus increasing the filling speed of the space between the newly formed layer 27 and the elastic membrane 23 (refresh).

This step, therefore, makes the need to remove the extraction plate 25 from the elastic membrane 23 and then move it closer again to proceed with the formation of a new layer unnecessary.

Figure 7D:
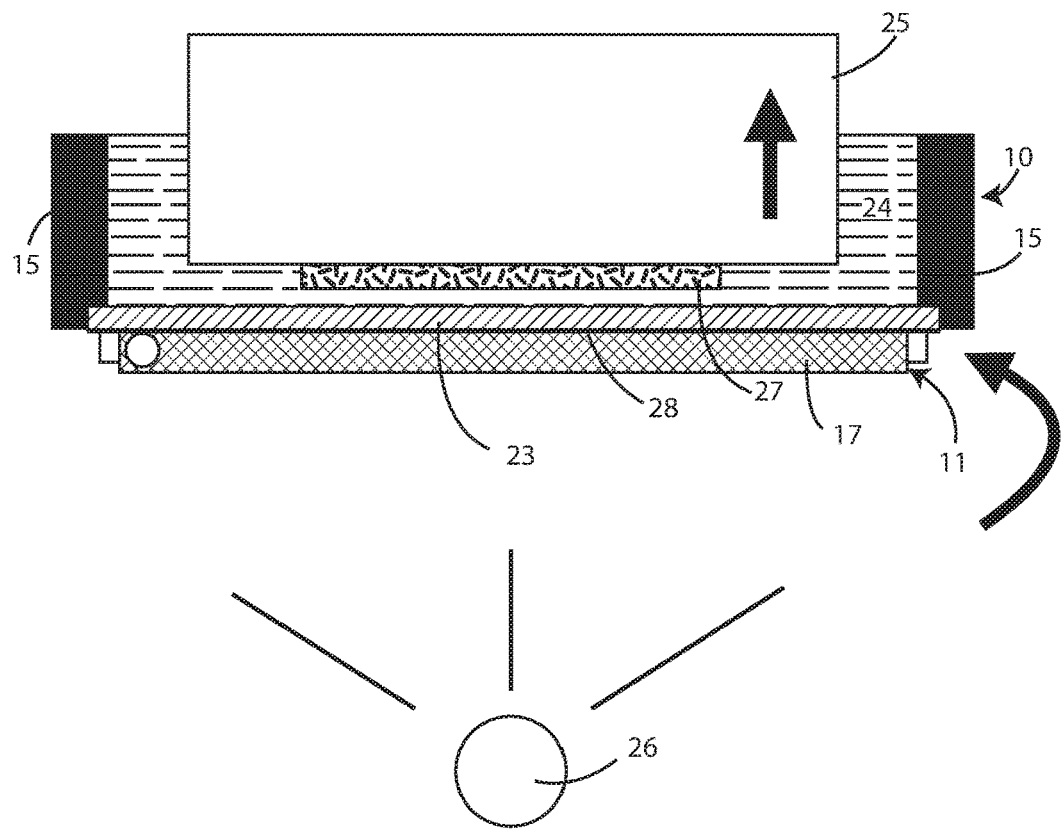

In fact, as shown in FIG. 7D, in the subsequent step it is sufficient to slightly remove the extraction plate 25 and at the same time return the rigid support 11 to the starting position, so that the extraction plate 25 and the rigid support 11 are in the position for the generation of a new layer, and then the light source 26 can be switched back on.

In FIG. 7C, the layer 28 of adhesive component is always shown adherent to the elastic membrane 23, but according to the present invention it is indifferent whether the layer 28 of adhesive component remains adherent to the elastic membrane 23, to the support 11 or partly to the elastic membrane 23 and partly to the support 11. Furthermore, the printing method according to the present invention may also occur without the need to add a layer 28 of adhesive component between the rigid support 11 and the elastic membrane 23, if the adhesion force generated by the suction effect between the glass plate 17 and the elastic membrane 23 is greater than the adhesion force generated between the same elastic membrane 23 and the newly cured layer 27

The method of use of the apparatus for 3D printing according to the present invention therefore allows to reduce the mechanical stress of the object, saving three steps for the printing routines with respect to the method previously illustrated with reference to FIGS. 6A-6F, with a significant reduction of printing times and with a better surface quality of the object to be produced.

The present invention has been described for illustrative but not limitative purposes, according to its preferred embodiments, but it is to be understood that variations and/or modifications may be made by those skilled in the art without departing from the relative scope of protection, as defined by the attached claims.

The invention claimed is:

1. Apparatus for 3D printing of bottom-up photo-curing type, comprising a light source (26) above which a tank (10) containing a photo-curing liquid material (24) is placed (24) inside which it is immersed an extraction plate (25), which is configured for alternating rectilinear motion, along a direction perpendicular to the bottom of said tank (10) from a position at a distance from the bottom of said tank (10) equal to the thickness of a layer (27) obtainable by photo-curing of said photo-curing liquid material (24), the bottom (14) of said tank (10) being constituted by an elastic membrane (23) transparent to the radiation of said light source (26), said tank (10) being positioned in correspondence with a hole (13) of a support plate (12), said hole being provided with a rigid support (11), transparent to the radiation of said light source (26), wherein said rigid support (11) is configured for displacing with respect to said hole (13), from a position in which said rigid support (11) occupies said hole (13), and is in contact with elastic membrane (23), to a position in which said rigid support (11) deviates from said hole (13) and from said elastic membrane (23), wherein an adhesive component comprising a layer of an adhesive is applied between said elastic membrane (23) and said rigid support (11) and configured to control a reversible movement of said elastic membrane (23) with respect to said tank (10) in response to said displacing of said rigid support (11), wherein the elastic membrane (23) being at least partly detachable from the rigid support (11), and the adhesive component being configured to control detachment of the elastic membrane (23) from the rigid support (11) to reduce mechanical stress the elastic membrane (23) is subjected to.

2. Apparatus for 3D printing according to claim 1, wherein said tank (10) is removable.

3. Apparatus for 3D printing according to claim 1, wherein the rigid support (11) comprises a glass plate (17).

4. Apparatus for 3D printing according to claim 1, wherein the glass plate (17) comprises a borosilicate glass plate.

5. Apparatus for 3D printing according to claim 3, wherein applying the adhesive component to the rigid support increases a suction effect between the glass plate (17) of the rigid support (11) and the elastic membrane (23).

6. Apparatus for 3D printing according to claim 1, wherein an adhesion force between the rigid support (11) and the elastic membrane (23) is greater than an adhesion force generated between the elastic membrane (23) and a newly cured layer (27).

7. Apparatus for 3D printing according to claim 1, wherein the elastic membrane (23) triggers a peeling phenomenon by gently detaching from the newly cured layer (27).

8. Method for 3D printing of bottom-up photo-curing type comprising the following steps:
   a) providing the apparatus of claim 1;
   b) forming a solid layer (27) on an extraction plate (25) by photo-curing a photo-curing liquid material (24) comprised inside a tank (10), in the space between an extraction plate (25) and an elastic membrane (23), wherein a rigid support (11) is in contact with the lower side of said elastic membrane (23);
   c) removing said rigid support (11) from said elastic membrane (23), said elastic membrane (23) remaining attached to said rigid support (11), with progressive detachment of said extraction plate (25);
   d) lifting of said extraction plate (25), up to a new position of forming a solid layer (27);
   e) returning of said rigid support (11) to its initial position, in contact with said elastic membrane (23).

* * * * *